(12) United States Patent
Rohit et al.

(10) Patent No.: US 8,165,543 B2
(45) Date of Patent: Apr. 24, 2012

(54) POWER AMPLIFIER ADJUSTMENT FOR TRANSMIT BEAMFORMING IN MULTI-ANTENNA WIRELESS SYSTEMS

(75) Inventors: Nabar U. Rohit, Sunnyvale, CA (US); Hongyuan Zhang, Sunnyvale, CA (US)

(73) Assignee: Marvell World Trade Ltd., St. Michael (BM)

( * ) Notice: Subject to any disclaimer, the term of this patent is extended or adjusted under 35 U.S.C. 154(b) by 1018 days.

(21) Appl. No.: 12/109,257

(22) Filed: Apr. 24, 2008

(65) Prior Publication Data
US 2008/0266176 A1     Oct. 30, 2008

Related U.S. Application Data

(60) Provisional application No. 60/913,936, filed on Apr. 25, 2007.

(51) Int. Cl.
*H01Q 11/12* (2006.01)
*H04B 1/04* (2006.01)

(52) U.S. Cl. .................. 455/127.3; 455/115.3; 455/129

(58) Field of Classification Search ............... 455/115.1, 455/115.3, 127.2, 127.3, 129
See application file for complete search history.

(56) References Cited

U.S. PATENT DOCUMENTS

| | | | |
|---|---|---|---|
| 7,139,324 B1 | 11/2006 | Ylitalo et al. | |
| 7,822,128 B2* | 10/2010 | Maltsev et al. | 375/260 |
| 2003/0181173 A1 | 9/2003 | Sugar et al. | |
| 2006/0040624 A1* | 2/2006 | Lipka | 455/114.3 |
| 2006/0116087 A1* | 6/2006 | Sugar et al. | 455/103 |

OTHER PUBLICATIONS

Leung et al., "Mobility Management Using Proxy Mobile IPv4", Internet Engineering Task Force, Jan. 10, 2007.
S. A. Mujtaba, "IEEE P802.11—Wireless LANS, TGn Sync Proposal Technical Specification," doc.: IEEE 802.11—04/0889r6, May 2005.
IEEE Standard for Local and metropolitan area networks: Part 16: Air Interface for Fixed Broadband Wireless Access Systems-Amendment 2: Medium Access Control Modifications and Additional Physical Layer Specifications for 2-11 GHZ, IEEE Std. 802.16a 2003, Apr. 1, 2003.
IEEE Standard for Local and metropolitan area networks: Part 16: Air Interface for Fixed and Mobile Broadband Wireless Access Systems/Amendment 2: Physical and Medium Access Control Layers for Combined Fixed and Mobile operation in Licensed and Bands Corrigendum 1, IEEE Std. 802.16e and IEEE Std. 802.16 2004/Cor 1-2005, Feb. 28, 2006.
"Supplement to IEEE Standard for Information technology—Telecommunications and information exchange between systems-Local and metropolitan area networks-Specific requirements Part 11: Wireless LAN Medium Access Control (MAC) and Physical Layer (PHY) specifications: High-speed Physical Layer in the 5 GHZ Band," IEEE Std. 802.11a, 1999.
"Supplement to IEEE Standard for Information technology—Telecommunications and information exchange between systems—Local and metropolitan area networks-Specific requirements Part 11: Wireless LAN Medium Access Control (MAC) and Physical Layer (PHY) specifications: Higher-speed Physical Layer Extension in the 2.4 GHZ Band," IEEE Std. 802.11b, 1999.

(Continued)

*Primary Examiner* — Christian Hannon

(57) ABSTRACT

One or more beamsteering matrices are applied to a plurality of signals to be transmitted via multiple antennas. The plurality of signals are provided to a plurality of power amplifiers coupled to the multiple antennas after applying the one or more beamsteering matrices to the plurality of signals. Signal energies are determined for the plurality of signals provided to the plurality of power amplifiers, and output power levels of the plurality of power amplifiers are adjusted based on the determined signal energies.

33 Claims, 9 Drawing Sheets

OTHER PUBLICATIONS

"Draft Supplement to Standard [for] Information technology—Telecommunications and information exchange between systems—Local and metropolitan area networks—Specific requirements, Part 11: Wireless LAN Medium Access Control (MAC) and Physical Layer (PHY) specifications: Further Higher-Speed Physical Layer Extension in the 2.4 GHz Band," IEEE Std. 802.11g/D2.8, May 2002.

Partial International Search Report for International Application No. PCT/US2008/061411 dated Jul. 1, 2008.

International Search Report in corresponding PCT/US2008/061411 dated Nov. 5, 2008.

Written Opinion in corresponding PCT/US2008/061411 dated Nov. 5, 2008.

* cited by examiner

POWER AMPLIFIER ADJUSTMENT FOR TRANSMIT BEAMFORMING IN MULTI-ANTENNA WIRELESS SYSTEMS

CROSS-REFERENCES TO RELATED APPLICATIONS

The present application claims the benefit of U.S. Provisional Application No. 60/913,936, entitled "Power Amplifier (PA) Backoff for Transmit Beamforming in Multi-Antenna Wireless Systems," filed on Apr. 25, 2007, which is hereby incorporated by reference herein in its entirety.

FIELD OF TECHNOLOGY

The present disclosure relates generally to wireless communication systems and, more particularly, to an apparatus and method for varying the power of amplifiers in a multi-antenna transmitter in conjunction with transmit beamsteering.

DESCRIPTION OF THE RELATED ART

An ever-increasing number of relatively cheap, low power wireless data communication services, networks and devices have been made available over the past numbers of years, promising near wire speed transmission and reliability. Various wireless technology is described in detail in the 802.11 IEEE Standard, including for example, the IEEE Standard 802.11a (1999) and its updates and amendments, the IEEE Standard 802.11g (2003), as well as the IEEE Standard 802.11n now in the process of being adopted, all of which are collectively incorporated herein fully by reference. These standards have been or are in the process of being commercialized with the promise of 54 Mbps or more effective bandwidth, making them a strong competitor to traditional wired Ethernet and the more ubiquitous "802.11b" or "WiFi" 11 Mbps mobile wireless transmission standard.

Generally speaking, transmission systems compliant with the IEEE 802.11a and 802.11g or "802.11a/g" as well as the 802.11n standards achieve their high data transmission rates using Orthogonal Frequency Division Modulation or OFDM encoded symbols mapped up to a 64 quadrature amplitude modulation (QAM) multi-carrier constellation. Generally speaking, the use of OFDM divides the overall system bandwidth into a number of frequency sub-bands or channels, with each frequency sub-band being associated with a respective sub-carrier upon which data may be modulated. Thus, each frequency sub-band of the OFDM system may be viewed as an independent transmission channel within which to send data, thereby increasing the overall throughput or transmission rate of the communication system.

Generally, transmitters used in the wireless communication systems that are compliant with the aforementioned 802.11a/802.11g/802.11n standards as well as other standards such as the 802.16a/e/j/m IEEE Standard, perform multi-carrier OFDM symbol encoding (which may include error correction encoding and interleaving), convert the encoded symbols into the time domain using Inverse Fast Fourier Transform (IFFT) techniques, and perform digital to analog conversion and conventional radio frequency (RF) upconversion on the signals. These transmitters then transmit the modulated and upconverted signals after appropriate power amplification to one or more receivers, resulting in a relatively high-speed time domain signal with a large peak-to-average ratio (PAR).

Likewise, the receivers used in the wireless communication systems that are compliant with the aforementioned 802.11a/802.11g/802.11n and 802.16a/e/j/m IEEE standards generally include an RF receiving unit that performs RF downconversion and filtering of the received signals (which may be performed in one or more stages), and a baseband processor unit that processes the OFDM encoded symbols bearing the data of interest. Generally, the digital form of each OFDM symbol presented in the frequency domain is recovered after baseband downconversion, conventional analog to digital conversion and Fast Fourier Transformation of the received time domain analog signal. Thereafter, the baseband processor performs frequency domain equalization (FEQ) and demodulation to recover the transmitted symbols, and these symbols are then processed in a viterbi decoder to estimate or determine the most likely identity of the transmitted symbol. The recovered and recognized stream of symbols is then decoded, which may include deinterleaving and error correction using any of a number of known error correction techniques, to produce a set of recovered signals corresponding to the original signals transmitted by the transmitter.

Similarly, in a single carrier communication system, such as the IEEE 802.11b standard, a transmitter performs symbol encoding (which may include error correction encoding and interleaving), digital to analog conversion and conventional radio frequency (RF) upconversion on the signals. These transmitters then transmit the modulated and upconverted signals after appropriate power amplification to one or more receivers. A receiver in a single carrier communication system includes an RF receiving unit that performs RF downconversion and filtering of the received signals (which may be performed in one or more stages), and a baseband processor unit that demodulates and decodes (which may include deinterleaving and error correction) the encoded symbols to produce a set of recovered signals corresponding to the original signals transmitted by the transmitter.

In wireless communication systems, the RF modulated signals generated by the transmitter may reach a particular receiver via a number of different propagation paths, the characteristics of which typically change over time due to the phenomena of multi-path and fading. Moreover, the characteristics of a propagation channel differ or vary based on the frequency of propagation. To compensate for the time varying, frequency selective nature of the propagation effects, and generally to enhance effective encoding and modulation in a wireless communication system, each receiver of the wireless communication system may periodically develop or collect channel state information (CSI) for each of the frequency channels, such as the channels associated with each of the OFDM sub-bands discussed above. Generally speaking, CSI is information defining or describing one or more characteristics about each of the OFDM channels (for example, the gain, the phase and the SNR of each channel). In a single carrier communication system, information similar to CSI information may be developed by the receiver. Upon determining the CSI for one or more channels, the receiver may send this CSI back to the transmitter, which may use the CSI for each channel to precondition the signals transmitted using that channel so as to compensate for the varying propagation effects of each of the channels.

An important part of a wireless communication system is therefore the selection of the appropriate data rates, and the coding and modulation schemes to be used for a data transmission based on channel conditions. Generally speaking, it is desirable to use the selection process to maximize throughput while meeting certain quality objectives, such as those defined by a desired frame error rate (FER), latency criteria, etc.

To further increase the number of signals which may be propagated in the communication system and/or to compensate for deleterious effects associated with the various propagation paths, and to thereby improve transmission performance, it is known to use multiple transmission and receive antennas within a wireless transmission system. Such a system is commonly referred to as a multiple-input, multiple-output (MIMO) wireless transmission system and is specifically provided for within the 802.11n IEEE Standard now being adopted. Generally speaking, the use of MIMO technology produces significant increases in spectral efficiency and link reliability, and these benefits generally increase as the number of transmission and receive antennas within the MIMO system increases.

In addition to the frequency channels created by the use of OFDM, for example, a MIMO channel formed by the various transmission and receive antennas between a particular transmitter and a particular receiver includes a number of independent spatial channels. As is known, a wireless MIMO communication system can provide improved performance (e.g., increased transmission capacity) by utilizing the additional dimensionalities created by these spatial channels for the transmission of additional data. Of course, the spatial channels of a wideband MIMO system may experience different channel conditions (e.g., different fading and multi-path effects) across the overall system bandwidth and may therefore achieve different SNRs at different frequencies (i.e., at the different OFDM frequency sub-bands) of the overall system bandwidth. Consequently, the number of information bits per modulation symbol (i.e., the data rate) that may be transmitted using the different frequency sub-bands of each spatial channel for a particular level of performance may differ from frequency sub-band to frequency sub-band.

However, instead of using the various different transmission and receive antennas to form separate spatial channels on which additional information is sent, better transmission and reception properties can be obtained in a MIMO system by using each of the various transmission antennas of the MIMO system to transmit the same signal while phasing (and amplifying) this signal as it is provided to the various transmission antennas to achieve beamforming or beamsteering. Generally speaking, beamforming or beamsteering creates a spatial gain pattern having one or more high gain lobes or beams (as compared to the gain obtained by an omni-directional antenna) in one or more particular directions, while reducing the gain over that obtained by an omni-directional antenna in other directions. If the gain pattern is configured to produce a high gain lobe in the direction of each of the receiver antennas, the MIMO system can obtain better transmission reliability between a particular transmitter and a particular receiver, over that obtained by single transmitter-antenna/receiver-antenna systems.

There are many known techniques for determining a steering matrix specifying the beamsteering coefficients that need to be used to properly condition the signals being applied to the various transmission antennas so as to produce the desired transmit gain pattern at the transmitter. As is known, these coefficients may specify the gain and phasing of the signals to be provided to the transmitter antennas to produce high gain lobes in particular or predetermined directions. These techniques include, for example, transmit-MRC (maximum ratio combining) and singular value decomposition (SVD).

An important part of determining the steering matrix is taking into account the specifics of the channel between the transmitter and the receiver, referred to herein as the forward channel. As a result, steering matrixes are typically determined based on the CSI of the forward channel. To determine the CSI or other specifics of the forward channel, the transmitter must first send a known test or calibration signal to the receiver, which then computes or determines the specifics of the forward channel (e.g., the CSI for the forward channel) and then sends the CSI or other indications of the forward channel back to the transmitter, thereby requiring signals to be sent both from the transmitter to the receiver and then from the receiver back to the transmitter in order to perform beamforming in the forward channel. This exchange typically occurs each time the forward channel is determined (e.g., each time a steering matrix is to be calculated for the forward channel).

Determining a steering matrix based on the CSI (or other information) of the forward channel is often referred to as explicit beamforming. To reduce the amount of startup exchanges required to perform explicit beamforming, it is known to perform implicit beamforming in a MIMO communication system. With implicit beamforming, the steering matrix is calculated or determined based on the assumption that the forward channel (i.e., the channel from the transmitter to the receiver in which beamforming is to be accomplished) can be estimated from the reverse channel (i.e., the channel from the receiver to the transmitter). In particular, the forward channel can ideally be estimated as the matrix transpose of the reverse channel. Thus, in the ideal case, the transmitter only needs to receive signals from the receiver to produce a steering matrix for the forward channel, as the transmitter can use the signals from the receiver to determine the reverse channel, and can simply estimate the forward channel as a matrix transpose of the reverse channel. As a result, implicit beamforming reduces the amount of startup exchange signals that need to be sent between a transmitter and a receiver because the transmitter can estimate the forward channel based solely on signals sent from the receiver to the transmitter. Unfortunately, however, radio frequency (RF) chain impairments in the form of gain/phase imbalances and coupling losses impair the ideal reciprocity between the forward and the reverse channels, making it necessary to perform additional calibration exchanges each time the forward channel is being determined, to account for these impairments.

SUMMARY

In one embodiment, a method includes applying one or more beamsteering matrices to a plurality of signals to be transmitted via multiple antennas. The method also includes providing the plurality of signals to a plurality of power amplifiers coupled to the multiple antennas after applying the one or more beamsteering matrices to the plurality of signals. The method additionally includes determining signal energies for the plurality of signals provided to the plurality of power amplifiers, and adjusting output power levels of the plurality of power amplifiers based on the determined signal energies.

In another embodiment, a power amplifier control apparatus comprises a controller that is configured to determine signal energies for a plurality of signals provided to a plurality of power amplifiers coupled to a plurality of transmit antennas, wherein one or more beamsteering matrices are applied to the plurality of signals. Additionally, the controller is configured to generate control signals to adjust output power levels of the plurality of power amplifiers based on the determined signal energies.

In yet another embodiment, a wireless transmitter for transmitting an information signal comprises a signal modulator adapted to modulate the information signal to produce a modulated signal. Also, the wireless transmitter comprises a plurality of transmission antennas, and a beamforming network coupled between the signal modulator and the plurality of transmission antennas. Additionally, the wireless transmitter comprises a first controller coupled to the beamforming network to control the beamforming network using one or more steering matrices so as to produce a transmit gain pattern having one or more high gain lobes when the modulated signal is transmitted via the plurality of transmission antennas. The wireless transmitter further comprises a plurality of power amplifiers coupled to the beamforming network and the plurality of transmission antennas, and a second controller coupled to the plurality of amplifiers. The second controller is configured to determine signal energies for a plurality of signals provided to the plurality of power amplifiers, and generate control signals to adjust output power levels of the plurality of power amplifiers based on the determined signal energies.

In still another embodiment, a method of wirelessly transmitting an information signal via multiple antennas includes modulating the information signal to produce a modulated signal, and applying one or more beamsteering matrices to the modulated signal to produce a plurality of output signals. The method additionally includes providing the plurality of output signals to a plurality of power amplifiers, wherein the plurality of power amplifiers are coupled to the multiple antennas. The method also includes determining signal energies for the plurality of output signals, and adjusting output power levels of the plurality of power amplifiers based on the determined signal energies.

DETAILED DESCRIPTION

While the power amplifier control techniques described herein for effecting a wireless data transmission are described as being used in communication systems that use one of the IEEE Standard 802.11x communication standards, techniques such as described herein may be used in various other types of wireless communication systems and are not limited to those conforming to one or more of the IEEE Standard 802.11x standards. As just two examples, power amplifier control techniques such as described herein may be used in systems that use one of the IEEE Standard 802.16x communication standards or in systems that use code division multiple access (CDMA) modulation.

Figure 1:
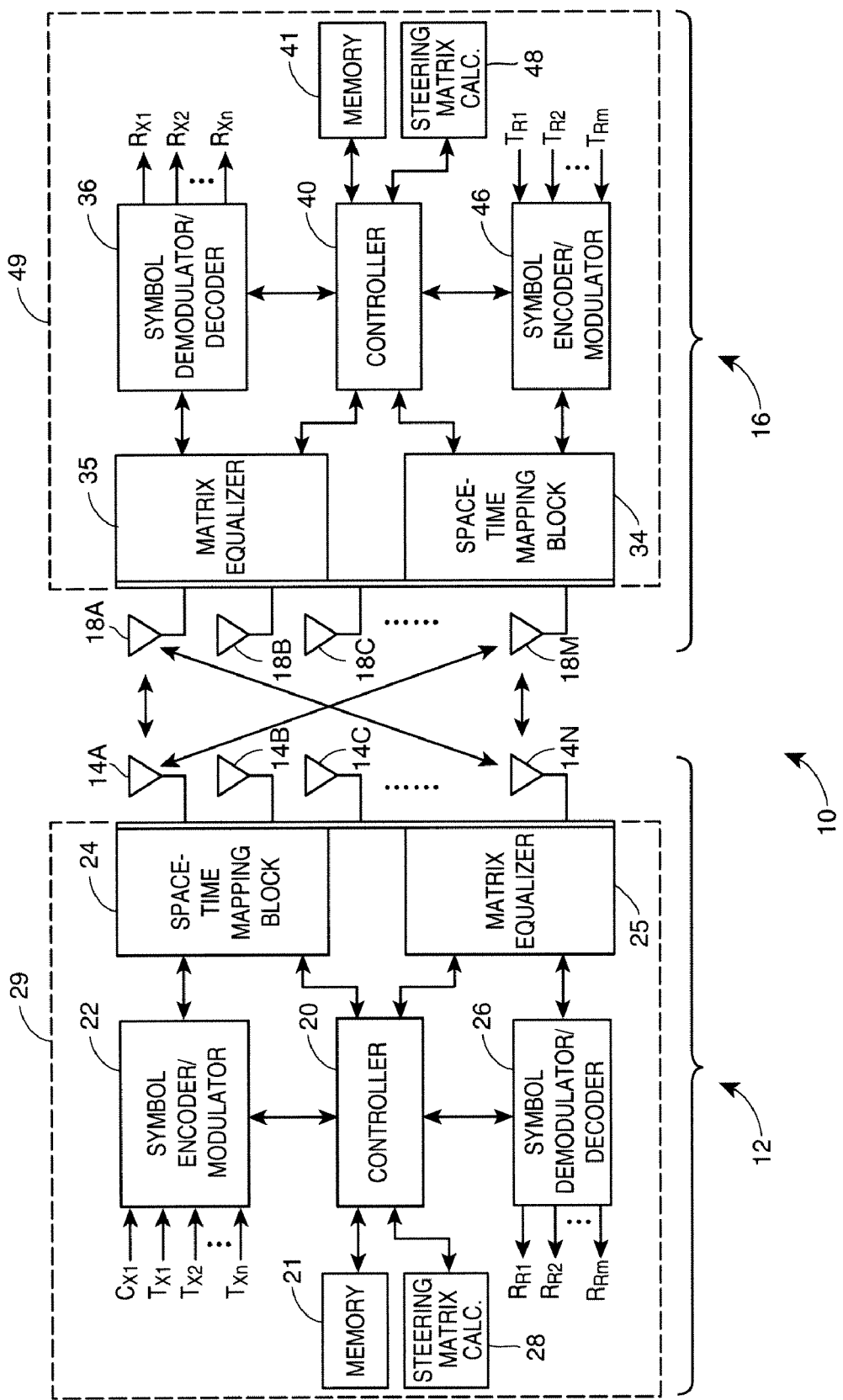
FIG. 1 is a block diagram of a wireless MIMO communication or transmission system that implements transmit beamforming and than may utilize power amplifier control techniques such as described herein.

Referring now to FIG. 1, a MIMO communication system 10 is illustrated in block diagram form as generally including a single transmitter 12 having multiple transmission antennas 14A-14N and a single receiver 16 having multiple receiver antennas 18A-18M. The number of transmission antennas 14A-14N can be the same as, more than, or less than the number of receiver antennas 18A-18M. As shown in FIG. 1, the transmitter 12 may include a controller 20 coupled to a memory 21, a symbol encoder and modulator unit 22 and a space-time filtering or mapping block 24, also referred to herein as a transmit beamforming network. The transmitter 12 may also include a matrix equalizer 25 and a symbol demodulator and decoder unit 26 to perform demodulation and decoding of signals received via the antennas 14A-14N in a receive mode. Additionally, the transmitter 12 includes a steering matrix calculation unit 28. The controller 12 may be any desired type of controller and both the controller 12 and the steering matrix calculation unit 28 may be implemented as one or more standard multi-purpose, programmable processors, such as micro-processors, as application specific integrated circuits (ASICs), etc., or may be implemented using any other desired types of hardware, software and/or firmware. Likewise, the space-time mapping block 24 or beamforming network, and the matrix equalizer 25 may be implemented using known or standard hardware and/or software elements. If desired, various of the transmitter components, such as the controller 20, the modulator unit 22, the demodulator unit 26, the steering matrix calculation unit 28, the space-time mapping block 24 and the matrix equalizer 25 may be implemented in the same or in different hardware devices, such as in the same or different processors. Additionally, each of these components of the transmitter 12 may be disposed in a housing 29 (shown in dotted relief in FIG. 1). Still further, the routines or instructions for implementing the functionality of any of these components may be stored in the memory 21 or within other memory devices associated with the individual hardware used to implement these components.

During operation, information signals $T_{x1}$-$T_{xn}$ which are to be transmitted from the transmitter 12 to the receiver 16 are provided to the symbol encoder and modulator unit 22 for encoding and modulation. Of course, any desired number of signals $T_{x1}$-$T_{xn}$ may be provided to the modulator unit 22, with this number generally being limited by the modulation scheme used by and the bandwidth associated with the MIMO communication system 10. Additionally, the signals $T_{x1}$-$T_{xn}$ may be any type of signals, including analog or digital signals, and may represent any desired type of data or information. Additionally, if desired, a known test or control signal $C_{x1}$ (which may be stored in the memory 21) may be provided to the symbol encoder and modulator unit 22 for use in determining CSI related information describing the characteristics of the channel(s) between the transmitter 12 and the receiver 16. If desired, the same control signal or a different control signal may be used to determine the CSI for each frequency and/or spatial channel used in the MIMO communication system 10. The control signal $C_{x1}$ may be a sounding packet, for example.

The symbol encoder and modulator unit 22 may interleave digital representations of the various signals $T_{x1}$-$T_{xn}$ and $C_{x1}$ and may perform any other known type(s) of error-correction encoding on the signals $T_{x1}$-$T_{xn}$ and $C_{x1}$ to produce one or more streams of symbols to be modulated and sent from the transmitter 12 to the receiver 16. While the symbols may be modulated using any desired or suitable QAM technique, such as using 64 QAM, these symbols may be modulated in any other known or desired manner including, for example, using any other desired phase and/or frequency modulation techniques. In any event, the modulated symbol streams are provided by the symbol encoder and modulator unit 22 to the space-time mapping block 24 for processing before being transmitted via the antennas 14A-14N. While not specifically shown in FIG. 1, the modulated symbol streams may be up-converted to the RF carrier frequencies associated with an OFDM technique (in one or more stages) before being processed by the space-time mapping block 24 in accordance with a beamforming technique more specifically described herein. Upon receiving the modulated signals, the space-time mapping block 24 or beamforming network processes the modulated signals by injecting delays and/or gains into the modulated signals based on a steering matrix provided by the controller 20 and/or the steering matrix calculation block, to thereby perform beamsteering or beamforming via the transmission antennas 14A-14N.

The signals transmitted by the transmitter 12 are detected by the receiver antennas 18A-18M and may be processed by a matrix equalizer 35 within the receiver 16 to enhance the reception capabilities of the antennas 18A-18M. As will be understood, the processing applied at the receiver 16 (as well as at the transmitter 12) may be based on, for example, the CSI developed by the receiver 16 in response to the transmission of the test or control signal $C_{x1}$ (e.g., a sounding packet). In any event, a symbol demodulator and decoder unit 36, under control of a controller 40, may decode and demodulate the received symbol strings as processed by the matrix equalizer 35. In this process, these signals may be downconverted to baseband. Generally, the matrix equalizer 35 and the demodulator and decoder unit 36 may operate to remove effects of the channel based on the CSI as well as to perform demodulation on the received symbols to produce a digital bit stream. In some cases, if desired, the symbol demodulator and decoder unit 36 may perform error correction decoding and deinterleaving on the bit stream to produce the received signals $R_{x1}$-$R_{xn}$ corresponding to the originally transmitted signals $T_{x1}$-$T_{xn}$.

As shown in FIG. 1, the receiver 16 may also include a memory 41 and a symbol encoder and modulator unit 46 which may receive one or more signals $T_{R1}$-$T_{Rm}$ which may be encoded and modulated using any desired encoding and modulation techniques. The encoded and modulated symbol stream may then be upconverted and processed by a space-time mapping block 34 to perform beamsteering based on a steering matrix developed by a steering matrix calculation unit 48, prior to being transmitted via the receiver antennas 18A-18N to, for example, the transmitter 12, thereby implementing the reverse link. As shown in FIG. 1, each of the receiver components may be disposed in a housing 49.

The matrix equalizer 25 and the demodulator/decoder unit 26 within the transmitter 12 operate similarly to the matrix equalizer 35 and the demodulator/decoder unit 36 of the receiver 16 to demodulate and decode the signals transmitted by the receiver 16 to produce the recovered signals $R_{R1}$-$R_{Rm}$. Here again, the matrix equalizer 25 may process the received signals in any known manner to enhance the separation and therefore the reception of the various signals transmitted by the antennas 18A-18M. Of course, the CSI for the various OFDM channel(s) may be used by the steering matrix calculation units 28 and 48 as well as by the controllers 20 and 40 to perform beamforming and to determine a steering matrix used by the space-time mapping blocks 24, 34. As noted above, the CSI, beamforming and other programs and data such as the steering matrix used by the units 28 and 48 and by the controllers 20 and 40 may be stored in the memories 21 and 41.

As is generally known, beamforming or beamsteering typically includes applying appropriate phases and gains to the various signals as sent through the multiple transmitter antennas 14A-14N, in a manner with causes the signals sent from the different transmitter antennas 14A-14N to constructively interact (add in phase) in certain predetermined directions and to deconstructively interact (cancel) in other directions. Thus, beamsteering typically produces a beam pattern having high gain regions (referred to as high gain lobes) in various predetermined directions and low gain regions (typically referred to as nulls) in other directions. The use of beamforming techniques in a MIMO system enables a signal to be sent with high gain (as compared to an omni-directional antenna) in certain directions, and to be sent with low gain (as compared to an omni-directional antenna) in other directions. Thus, in the MIMO system 10 of FIG. 1, beamforming may be used to enhance signal directivity towards the receiver antennas 18A-18M, which improves the SNR of the transmissions and results in more reliable transmissions. In this case, the beamforming technique will generally form high gain lobes in the direction of propagation at which the highest gain is desired, and in particular in the directions of propagation from the transmitter 12 to each of the receiver antennas 18A-18M of the receiver 16.

To implement beamforming in the transmitter 12, the steering matrix calculation unit 28 may determine or calculate a set of matrix coefficients (referred to herein as a steering matrix) which are used by the space-time mapping block or beamforming network 24 to condition the signals being transmitted by the antennas 14A-14N. If desired, the steering matrix for any particular frequency channel of the MIMO system 10 may be determined by the steering matrix calculation unit 28 based on the CSI determined for that channel (wherein the CSI is usually developed by and sent from the receiver 16 but may instead be developed from signals sent from the receiver 16 to the transmitter 12 in the reverse link as an estimate of the forward link).

Figure 2:
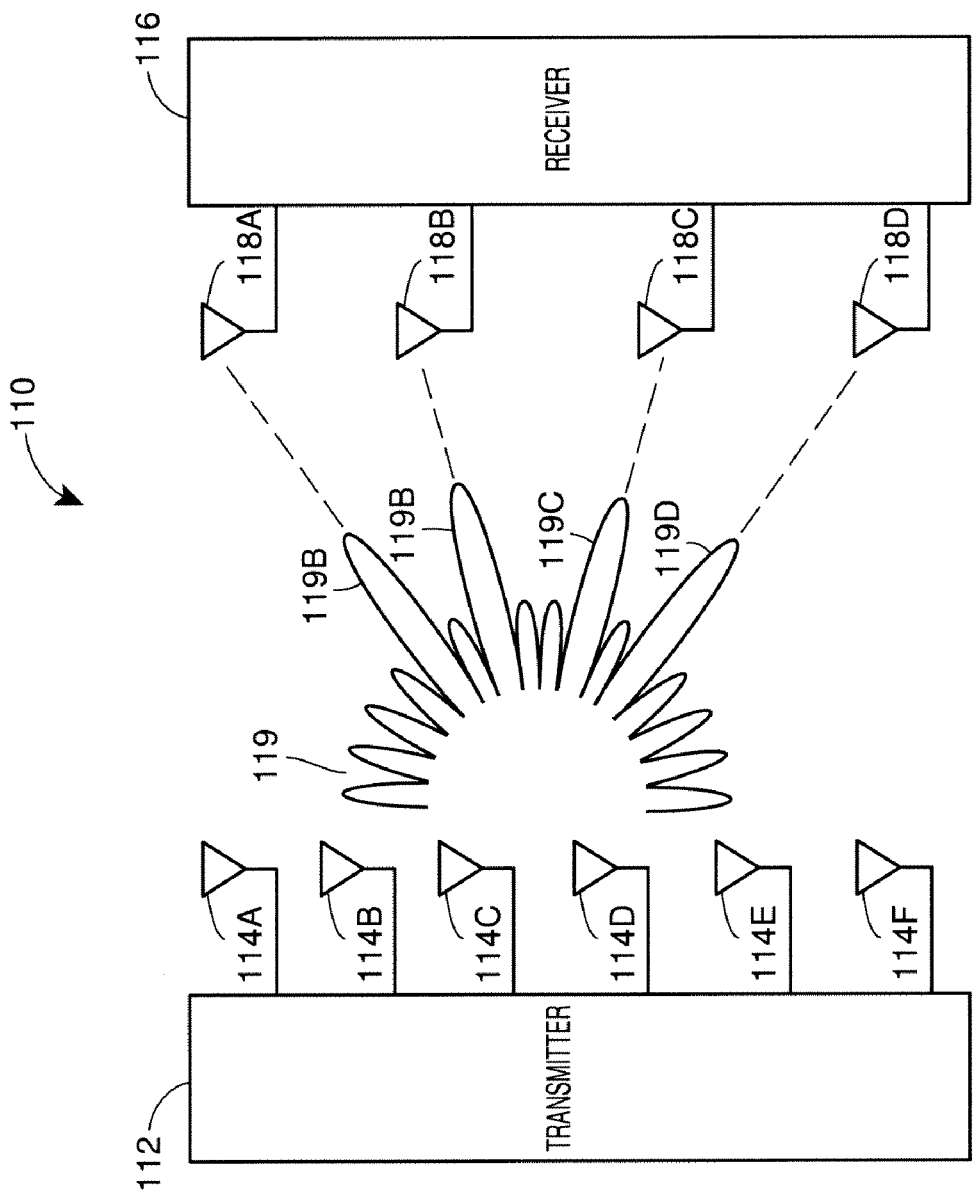
FIG. 2 is a block diagram illustrating a transmit gain pattern for wireless communications between a single transmitter and a single receiver implemented using transmitter beamforming.

To illustrate beamforming, FIG. 2 shows a MIMO communication system 110 having a single transmitter 112 with six transmission antennas 114A-114F, and a single receiver 116 with four receiver antennas 118A-118D. In this example, the steering matrix may be developed by the transmitter 112 or the receiver 116, using explicit beamforming or implicit beamforming methods. As illustrated in FIG. 2, the transmit gain pattern 119 includes multiple high gain lobes 1119A-119D disposed in the directions of the receiver antennas 118A-118D. The high gain lobes 1119A-119D are orientated in the directions of propagation from the transmitter 112 to the particular receiver antennas 118A-118D while lower gain regions, which may even include one or more nulls, are produced in other directions of propagation. While FIG. 2 illustrates a separate high gain lobe directed to each of the receiver antennas 118A-118D, it will be understood that the actual gain pattern produced by the beam steering matrix calculations may not necessarily include a separate high gain lobe for each of the receiver antennas 118A-118D. Instead, the gain pattern produced by the beam steering matrix calculations for the transmitter 112 may have a single high gain lobe covering or directed generally to more than one of the receiver antennas 118A-118D. Thus, it is to be understood that the beam pattern resulting from the creation of a steering matrix may or may not have separate high gain lobes separated by low gain regions or nulls for each of the receiver antennas.

Of course, developing the beam pattern 119 to have high gain regions and low gain regions may be performed in any desired manner and location. For example, any of the components within the transmitter 12 or within the receiver 16 of FIG. 1, including the controllers 20, 40 and the steering matrix calculation units 28, 48 may generate and/or process the steering information. For example, the controller 20 or the steering matrix calculation unit 28 within the transmitter 12 may determine the steering matrix for use in the space-time mapping block 24 for performing beamforming to the receiver 16. On the other hand, the controller 40 or the steering matrix calculation unit 48 within the receiver 16 may determine the steering matrix for use in the space-time mapping block 24 of the transmitter 12, and may then transmit this steering matrix to the transmitter 12.

The receiver 116 may compute the steering matrix to be used by the transmitter 112 based on the CSI developed by the receiver 116, and may send the actual steering matrix to the transmitter 112 to be used in transmitting information to the receiver 16. On the other hand, the steering matrix for the transmitter space-time mapping block 24 of FIG. 1 may be calculated by the steering matrix calculation unit 28 within the transmitter 12 based on the CSI provided and sent back from the receiver 16 to the transmitter 12. As another alternative, the steering matrix for the transmitter space-time mapping block 24 of FIG. 1 may be calculated by the steering matrix calculation unit 28 within the transmitter 12 based on the CSI associated with the reverse channel (i.e., from the receiver 16 to the transmitter 12).

Figure 3:
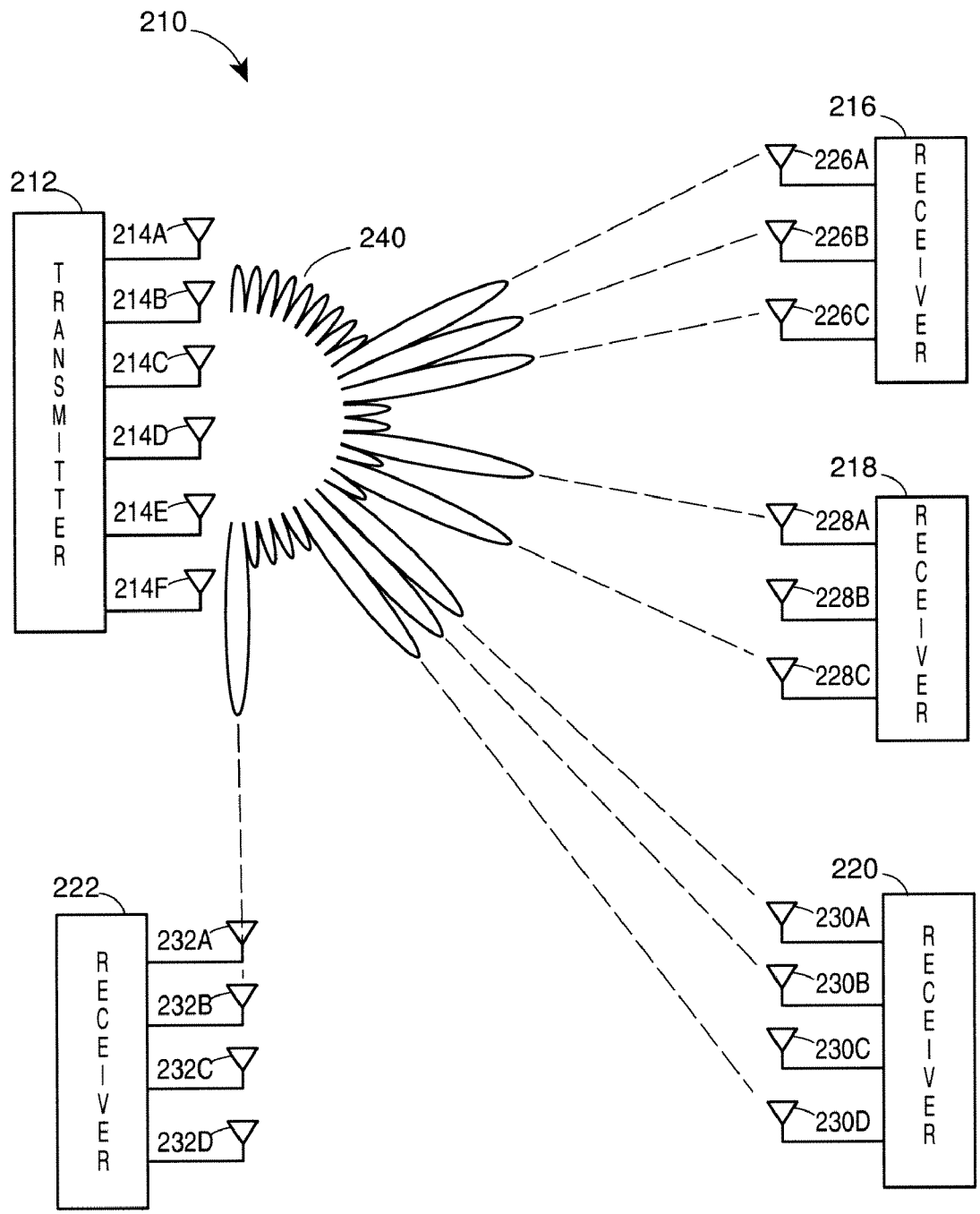
FIG. 3 is a block diagram illustrating a transmit gain pattern for wireless communications between a single transmitter and multiple receivers implemented using transmitter beamforming.

Of course, the techniques described herein are not limited to being used in a transmitter of a MIMO communication system communicating with a single receiver of the MIMO communication system, but can additionally be applied when a transmitter of a MIMO communication system is communicating with multiple receivers, each of which has one or more receiver antennas associated therewith. For example, FIG. 3 illustrates a MIMO system 210 in which a single transmitter 212 having multiple (in this example six) transmission antennas 214A-214F transmits to multiple receivers 216, 218, 220 and 222, each having multiple receiver antennas 226A-226C, 228A-228C, 230A-230D, and 232A-232D, respectively. While shown in this example as including three or four receiver antennas, any or all of the receivers 216, 218, 220, 222 of FIG. 3 could include different numbers of receiver antennas, including only a single receiver antenna if so desired. In any event, as illustrated by the transmit gain pattern 240 illustrated in FIG. 3, the steering matrix calculated and used by the transmitter 212 may be formed using CSI generated by one or more of the receivers 216, 218, 220 and 222 and/or using CSI generated based on one or more reverse channels between the transmitter 212 and the receivers 216, 218, 220 and 222.

In one example, the transmitter steering matrix may be calculated or determined using steering information generated by each of the receivers 216, 218, 220 and 222, so that, as shown by the transmit gain pattern 240, a high gain lobe is directed to at least one receiver antenna of each of the receivers 216, 218, 220, 222 at the same time. However, the steering matrix need not necessarily produce a high gain lobe directed to all of the receiver antennas of each of the receivers 216, 218, 220, 222, and not necessarily to all of the receiver antennas for any particular one of the receivers 216, 218, 220, 222. Thus, as illustrated in FIG. 3, the steering matrix for the transmitter 212 is determined in such a manner that a separate high gain lobe is directed to each of the receiver antennas 226A, 226B, 226C, 228A, 228C, 230A, 230B and 230D. However, due to the physical location of the receiver 222 and its antennas with respect to the transmitter 212, a single high gain lobe is directed to the receiver antennas 232A-232D, resulting in a single high gain lobe in the transmit gain pattern 240 directed to all of these receiver antennas.

In another example, the transmitter steering matrix may be calculated or determined using CSI information associated with reverse channels between the transmitter 212 and each of the receivers 216, 218, 220 and 222.

On the other hand, the transmitter 212 may develop a different steering matrix for each of the receivers 216, 218, 220 and 222 using steering information generated by the different receivers, and may use those steering matrices to beamform to the separate or different receivers at different times or using different channels, e.g., OFDM channels, of the system. As another example, the transmitter 212 may develop a different steering matrix for each of the receivers 216, 218, 220 and 222 using CSI information associated with reverse channels between the transmitter 212 and each of the receivers 216, 218, 220 and 222.

While, in many cases, it will be desirable to beamform in such a way to direct a high gain lobe to at least one receiver antenna from each receiver, it may not be necessary to implement this requirement in all cases. For example, a particular receiver may be in a direct line of sight from the transmitter to another receiver and therefore may be disposed in a high gain region of the transmitter and may thus adequately receive the transmitted signals from the transmitter without utilizing steering information generated by that receiver. As another example, a particular receiver may be disposed in a low gain region associated with the transmitter, but may be disposed relatively close to the transmitter so that the particular receiver adequately receives the signals transmitted by the transmitter without utilizing steering information generated by that receiver. Of course, if desired, the number and location (identity) of the receivers used in calculating the transmitter steering matrix can be determined in any manner, including by trial and error, in determining an acceptable or optimal steering matrix using steering information generated by more than one receiver. Still further, while the maximum gains of the high gain lobes of each of the transmit gain patterns shown in FIGS. 2 and 3 are shown as being the same, the steering matrix calculation units 28 and 48 may develop steering matrixes which produce high gain lobes with differing maximum gains.

Referring again to FIG. 1, the space-time mapping block 24 or beamforming network processes applies the steering matrix to the modulated signals to thereby perform beam-steering or beamforming via the transmission antennas 14A-14N. In a MIMO system, a beamformed or steered signal that is received by a receiver may be represented as:

$$y = HQ_{steer}s + n \quad \text{(Equation 1)}$$

where:
y is an $N_{Rx} \times 1$ received signal vector;
$N_{Rx}$ is a number of receive antennas;
n is an $N_{Rx} \times 1$ additive noise vector;
s an $N_{SS} \times 1$ transmitted signal vector;
$N_{SS}$ is a number of spatial streams;
H is an $N_{Rx} \times N_{Tx}$ matrix indicative of a MIMO channel;
$N_{Tx}$ is a number of transmit antennas; and
$Q_{steer}$ is an $N_{Tx} \times N_{SS}$ steering matrix.

In communication systems that utilize OFDM, Equation 1 may correspond to each subcarrier or to each of a plurality of groups of subcarriers. For example, in a MIMO-OFDM system, a beamformed or steered signal that is received by a receiver may be represented as:

$$y_k = H_k Q_{steer,k} s_k + n_k \quad \text{(Equation 2)}$$

where:
$y_k$ is an $N_{Rx} \times 1$ received signal vector for a $k^{th}$ subcarrier or a $k^{th}$ group of subcarriers;
$n_k$ is an $N_{Rx} \times 1$ additive noise vector for the $k^{th}$ subcarrier or $k^{th}$ group of subcarriers;
$s_k$ is an $N_{SS} \times 1$ transmitted signal vector for the $k^{th}$ subcarrier or $k^{th}$ group of subcarriers;
$H_k$ is an $N_{Rx} \times N_{Tx}$ matrix indicative of a MIMO channel for the $k^{th}$ subcarrier or $k^{th}$ group of subcarriers; and
$Q_{steer,k}$ is an $N_{Tx} \times N_{SS}$ spatial steering matrix for the $k^{th}$ subcarrier or $k^{th}$ group of subcarriers.

After the steering matrix has been applied to the modulated signals, the signals may be provided to a plurality of power amplifiers (PAs), each PA corresponding to a different one of the antennas 14. In a typical MIMO transmitter, each PA is driven at a maximum output power level. The maximum output power level may be a level at which output power is maximized and distortion remains at or below a defined, acceptable level or one or more other performance criteria are met.

Figure 4:
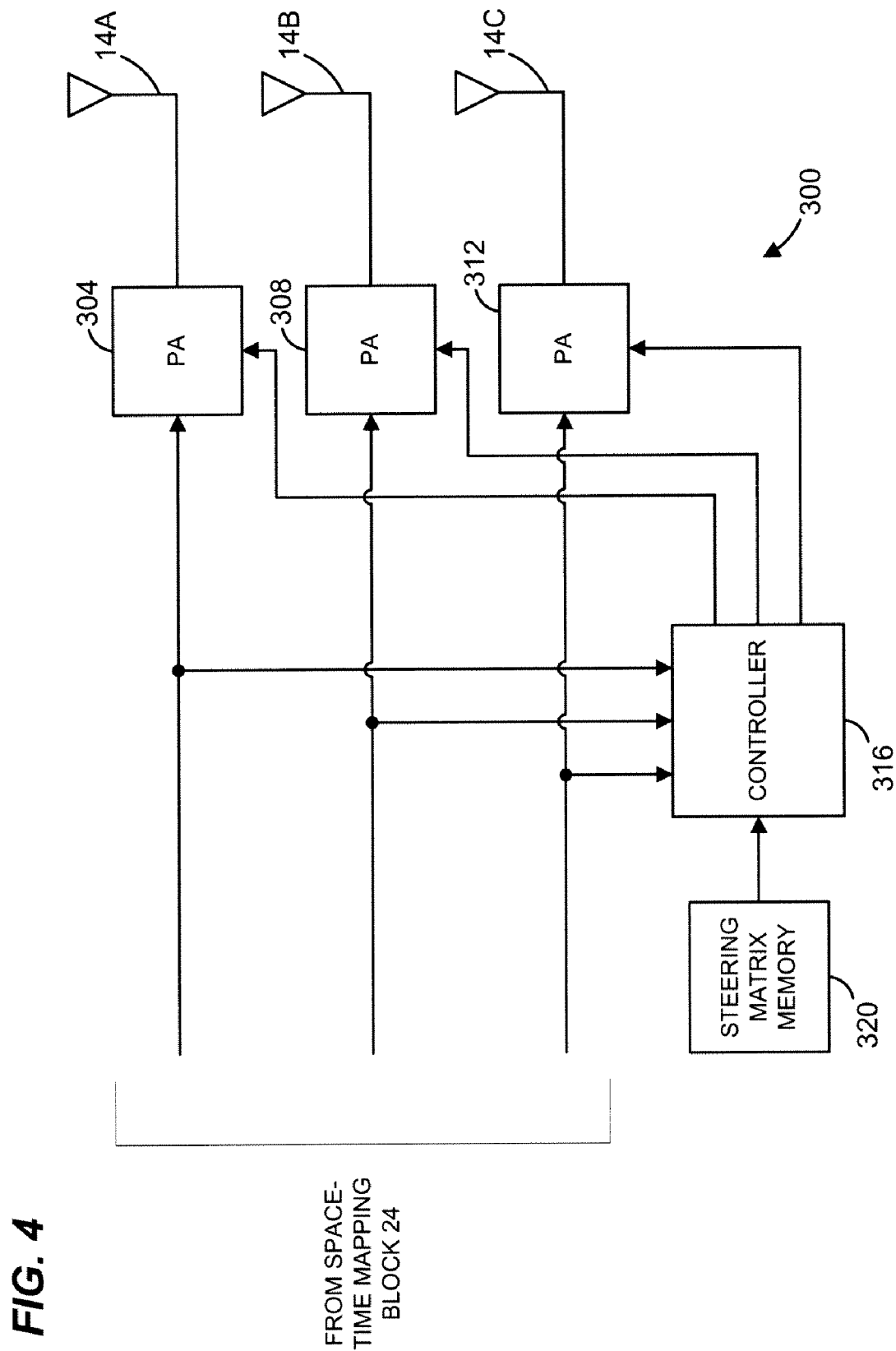
FIG. 4 is a block diagram of an example power amplifier control system that may be included in the transmitter 12 of FIG. 1.

FIG. 4 is a block diagram of an example power amplifier system 300 that may be utilized in a transmitter such as the transmitter 12 of FIG. 1. Generally, the power amplifier system 300 controls the output power of PAs based on the energy of signals that are provided as inputs to the PAs. For ease of explanation, the system 300 will be described with reference to FIG. 1. Of course, the example power amplifier system 300 can be utilized in transmitters other than the transmitter 12. Additionally, the transmitter 12 may utilize power amplifier systems other than the system 300.

In the example of FIG. 4, the system 300 includes three power amplifiers 304, 308, and 312, corresponding to three antennas 14A, 14B and 14C. In embodiments with different numbers of antennas (e.g., 2, 4, 5, 6, 7, etc.), the system may include a corresponding different number of power amplifiers. A controller 316 is coupled to the power amplifiers 304, 308, and 312, and generates power control signals that are provided to the power amplifiers 304, 308, and 312 to control the output power of each of the power amplifiers 304, 308, and 312. The power control signals control the power level of each of the power amplifiers 304, 308, and 312. The controller 316 may be included in the controller 20, the space-time mapping block 24, or any other component of the transmitter 12 illustrated in FIG. 1. Alternatively, the controller 316 may be a controller that is separate from the components of the transmitter 12 illustrated in FIG. 1. Additionally, the controller 316 may be a distributed controller that is distributed amongst one or more (or none)

The power amplifiers 304, 308, 312, receive outputs of the space-time mapping block (i.e., modulated signals to which the steering matrix has been applied) and amplify these signals for transmission via the antennas 14A, 14B and 14C. The controller 316 also may receive the outputs of the space-time mapping block. As will be described in more detail below, the controller 316 may generate the power control signals optionally based on the outputs of the space-time mapping block (i.e., the inputs to the PAs 304, 308 and 312).

The controller 316 optionally may be coupled to a steering matrix memory 320 that has stored therein the steering matrix that is applied by the space-time mapping block 24. The memory 320 may be included in the steering matrix calculator 28, the controller 20, the space-time mapping block 24, or any other component of the transmitter 12 illustrated in FIG. 1. Alternatively, the memory 320 may be separate from the components of the transmitter 12 illustrated in FIG. 1. As will be described in more detail below, the controller 316 may generate the power control signals optionally based on the steering matrix that is applied by the space-time mapping block 24.

Figure 5:
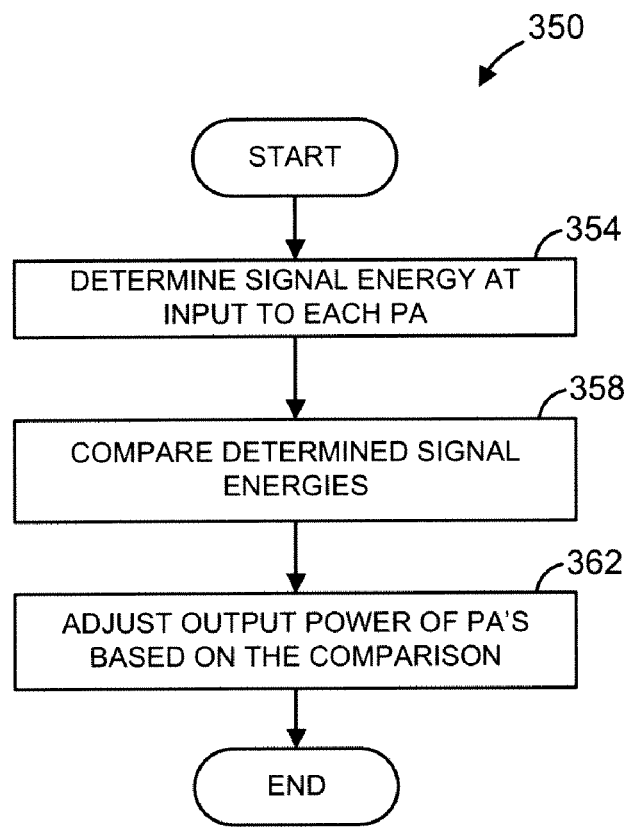
FIG. 5 is a flow diagram of an example method for power amplifier control that may be implemented in a power amplifier control system such as the example system of FIG. 4.

FIG. 5 is a flow diagram of an example method 350 for adjusting output power of PAs based on the energy of signals that are provided as inputs to the PAs. The method 350 may be implemented by the PA system 300 of FIG. 4 and will be described with reference to FIG. 4 for ease of explanation. Of course, the method 350 may be implemented by a system other than the system 300 of FIG. 4. Similarly, the system 300 may implement a method different than that of FIG. 5.

At a block 354, signal energies at the inputs to the PAs may be determined. In one embodiment, the actual signals provided to the PAs may be evaluated to determine the energy levels. The energy level of a signal provided to a PA may be calculated any of a variety of suitable techniques. As just one example, the energy level of a signal could be based on calculating an average squared amplitude of the signal. Referring to FIG. 4, if the controller 316 is coupled to the inputs of the PAs 304, 308, 312, the controller 316 may calculate the energy levels of the signals provided to the PAs 304, 308, 312.

In another embodiment, the energy levels of the signals provided to the PAs may be estimated by evaluating the steering matrix or matrices. Each row of the steering matrix may correspond to a different one of the antennas. Generally, the "energy" of a row of a steering matrix is proportional to the energy of the corresponding signal after the steering matrix has been applied to the signal. Thus, the energy of the input to a PA can be estimated based on the "energy" of a row of the steering matrix. For example, the energy of the input to a PA can be estimated based on a sum of squared magnitudes of coefficients in a row of a steering matrix.

In an OFDM system, there may be multiple steering matrices corresponding to each subcarrier or to each of a plurality of groups of subcarriers. In such systems, the energy of the input to a PA can be estimated based on each corresponding row of the multiple steering matrices. For example, a sum of squared magnitudes of coefficients in each corresponding row of the multiple steering matrices may be calculated. In another embodiment, the energy of the input to a PA can be estimated based on each corresponding row of a subset of the multiple steering matrices. For instance, steering matrices corresponding to less than all of the subcarriers or groups of subcarriers may be analyzed. For example, a subset of steering matrices may be selected, and a sum of squared magnitudes of coefficients in each corresponding row of the selected steering matrices may be calculated.

Referring to FIG. 4, if the controller 316 receives the steering matrix or matrices, the controller 316 may calculate the energy levels of the signals provided to the PAs 304, 308, 312 based on the steering matrix or matrices.

At a block 358, the signal energies determined at the block 354 may be compared. In one embodiment, comparing the signal energies may include determining a maximum signal energy, and then comparing each other signal energy to the maximum signal energy. In this embodiment, comparing each other signal energy to the maximum signal energy may include calculating a ratio for each other signal energy to the maximum signal energy. For example, if there are three antennas, the signal energies may be designated as $E_1$, $E_2$ and $E_3$. Assuming that it is determined that the maximum signal energy is $E_1$, then a ratio $\alpha_1$ may be calculated as $E_1/E_2$, and a ratio $\alpha_2$ may be calculated as $E_1/E_3$. Referring to FIG. 4, the controller 316 compares the signal energies.

At a block 362, output powers of the PAs may be adjusted based on the comparisons determined at the block 358. Generally, adjusting the output powers of the PAs may include adjusting the output powers to reflect relative energy levels of the signals provided to the PAs. For instance, the output powers of the PAs may be adjusted so that the relative output powers generally correspond to the relative energy levels of the signals provided to the PAs. For example, in an embodiment in which a ratio or ratios are calculated between a maximum input signal energy level and one or more other signal energy levels, the output powers of the PAs may be adjusted so that a ratio or ratios between the output power level of the PA corresponding to the maximum input signal energy level and the other output power level(s) correspond to the ratio or ratios of the input signal energy levels. For instance, the PA corresponding to the maximum input signal energy level may be set to a defined output power level, such as a maximum output power level. The output power levels of the remaining PA(s) may be controlled so that the ratio(s) between the defined output power level and the power levels of the remaining PAs correspond to the ratio(s) between the maximum input signal energy level and the input signal energy level(s) of the remaining PA(s).

Referring to FIG. 4, the controller 316 may adjust the output power of each of the PAs 304, 308, 312 by generating control signals that control the output power of each of the PAs 304, 308, 312. The controller 316 may adjust the output power of each of the PAs 304, 308, 312 so that the relative output powers of the PAs 304, 308, 312 correspond to the relative energy levels of the signals provided to the PAs 304, 308, 312.

Figure 6:
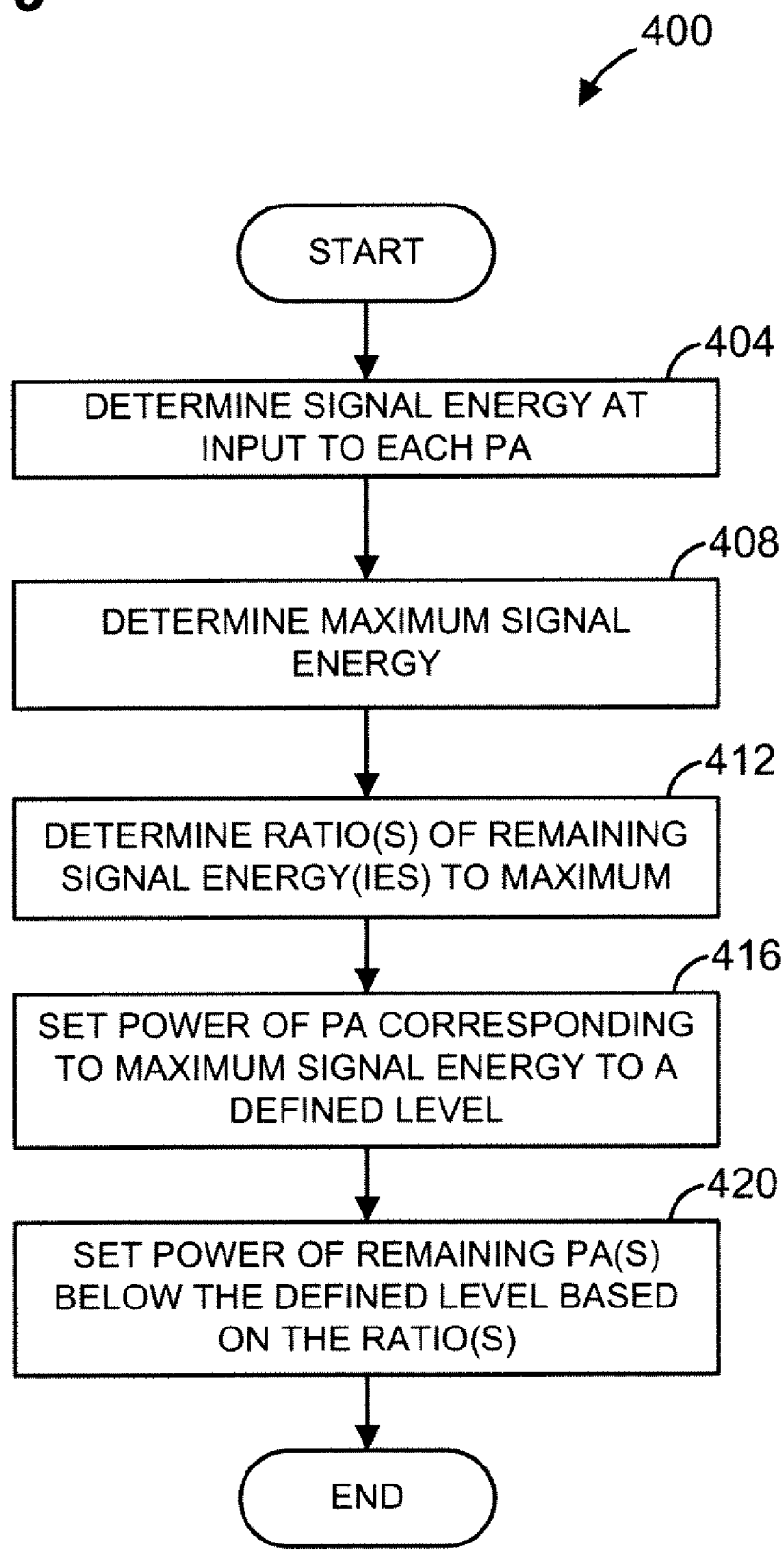
FIG. 6 is a flow diagram of another example method for power amplifier control that may be implemented in a power amplifier control system such as the example system of FIG. 4.

FIG. 6 is a flow diagram of an example method 400 that corresponds to one specific implementation of the method 350 of FIG. 5. It will be understood, however, that the method 350 may be implemented in many other ways as well. The method 400 may be implemented by the PA system 300 of FIG. 4 and will be described with reference to FIG. 4 for ease of explanation. Of course, the method 400 may be implemented by a system other than the system 300 of FIG. 4. Similarly, the system 300 may implement a method different than the method 400.

At a block 404, signal energies at the inputs to the PAs may be determined. The input signal energies may be determined as described above with respect to the block 354 of FIG. 5, for example. Referring to FIG. 4, if the controller 316 is coupled to the inputs of the PAs 304, 308, 312, the controller 316 may calculate the energy levels of the signals provided to the PAs 304, 308, 312. Additionally or alternatively, if the controller 316 receives the steering matrix or matrices, the controller 316 may calculate the energy levels of the signals provided to the PAs 304, 308, 312 based on the steering matrix or matrices.

At a block 408, a maximum of the input signal energies calculated at the block 404 may be determined. The maximum signal energy may be denoted as $E_{max}$. Referring to FIG. 4, the controller 316 may determine the maximum of the input signal energies.

At a block 412, one or more ratios may be determined for the one or more remaining signal energy levels. For example, if there are three antennas, the signal energies may be designated as $E_1$, $E_2$ and $E_3$. Assuming that it is determined that the $E_{max}=E_1$, then a ratio $\alpha_1$ may be calculated as $E_1/E_2$, and a ratio $\alpha_2$ may be calculated as $E_1/E_3$. Referring to FIG. 4, the controller 316 calculates the one or more ratios.

At a block 416, an output power level of the PA corresponding to $E_{max}$ may be set to a defined level. For example, the output power level of the PA corresponding to $E_{max}$ may be set to the maximum output power level. The maximum level may be adjustable and/or reconfigurable. As another example, the output power of the PA corresponding to $E_{max}$ may be set to a defined level that is less than the maximum level. Referring to FIG. 4, the controller 316 may set the output power of the PA corresponding to $E_{max}$ to the defined level by generating a control signal that is provided to the PA corresponding to $E_{max}$.

At a block 420, the output power of the one or more remaining PAs may be set below the defined level based on the ratios determined at the block 412. Continuing with the three-antenna example discussed above, if $E_{max}=E_1$, ratios $\alpha_1$ and $\alpha_2$ have been calculated, and assuming the output power level for the PA corresponding to $E_1$ has been set to a defined level $P_{max}$, the output power level of the PA corresponding $E_2$ can be set to $P_{max}/\alpha_1$, and the output power level of the of the PA corresponding $E_3$ can be set to $P_{max}/\alpha_2$ Referring to FIG. 4, the controller 316 may set the output power of the PA corresponding $E_2$ to $P_{max}/\alpha_1$, and may set the power level of the of the PA corresponding $E_3$ to $P_{max}/\alpha_2$ by generating control signals that are provided to the PAs corresponding to $E_2$ and $E_3$.

Figure 7:
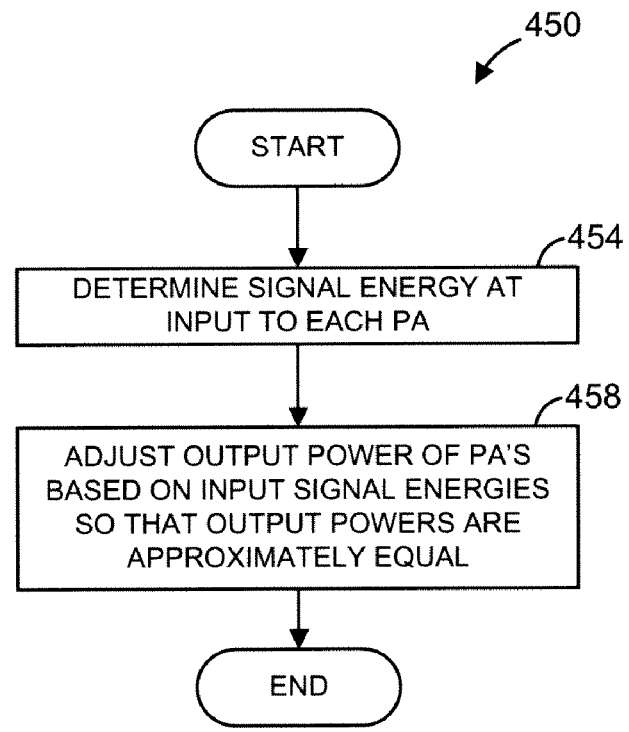
FIG. 7 is a flow diagram of another example method for power amplifier control that may be implemented in a power amplifier control system such as the example system of FIG. 4.

FIG. 7 is a flow diagram of another example method 450 for adjusting output power of PAs based on the energy of signals that are provided as inputs to the PAs. The method 450 may be implemented by the PA system 300 of FIG. 4 and will be described with reference to FIG. 4 for ease of explanation. Of course, the method 450 may be implemented by a system other than the system 300 of FIG. 4. Similarly, the system 300 may implement a method different than the method 450.

At a block 454, signal energies at the inputs to the PAs may be determined. The input signal energies may be determined as described above with respect to the block 354 of FIG. 5, for example. Referring to FIG. 4, if the controller 316 is coupled to the inputs of the PAs 304, 308, 312, the controller 316 may calculate the energy levels of the signals provided to the PAs 304, 308, 312. Additionally or alternatively, if the controller 316 receives the steering matrix or matrices, the controller 316 may calculate the energy levels of the signals provided to the PAs 304, 308, 312 based on the steering matrix or matrices.

At a block 458, output powers of the PAs may be adjusted based on the energy levels determined at the block 454 so that the output powers of the PAs are approximately the same level. In one embodiment, adjusting the output powers of the PAs may include adjusting the output powers based on relative energy levels of the signals provided to the PAs. For instance, similar to the block 408 of FIG. 6, a maximum of the input signal energies calculated at the block 454 may be determined (denoted as $E_{max}$). Then, similar to the block 412 of FIG. 6, one or more ratios may be determined for the one or more remaining signal energy levels. For example, if there are three antennas, the signal energies may be designated as $E_1$, $E_2$ and $E_3$. Assuming that it is determined that the $E_{max}=E_1$, then a ratio $\alpha_1$ may be calculated as $E_1/E_2$, and a ratio $\alpha_2$ may be calculated as $E_{max}/E_3$. Next, similar to the block 416 of FIG. 6, an output power level of the PA corresponding to $E_{max}$ may be set to a defined level. For example, the output power level of the PA corresponding to $E_{max}$ may be set to the maximum output power level. The maximum level may be adjustable and/or reconfigurable. As another example, the output power of the PA corresponding to $E_{max}$ may be set to a defined level that is less than the maximum level. Then, the output power of the one or more remaining PAs may be set based on the determined ratios so that the output powers of the remaining PAs are also at the defined level. Continuing with the three-antenna example discussed above, if $E_{max}=E_1$, ratios $\alpha_1$ and $\alpha_2$ have been calculated, and assuming the output power level for the PA corresponding to $E_1$ has been set to a defined level $P_{max}$, the output power level of the PA corresponding $E_2$ can be set to $P_{max} \cdot \alpha_1$, and the output power level of the of the PA corresponding $E_3$ can be set to $P_{max} \cdot \alpha_2$. Referring to FIG. 4, the controller 316 may set the output power of the PA corresponding $E_2$ to $P_{max} \cdot \alpha_1$, and may set the power level of the of the PA corresponding $E_3$ to $P_{max} \cdot \alpha_2$ by generating control signals that are provided to the PAs corresponding to $E_2$ and $E_3$.

In another embodiment, adjusting the output powers of the PAs may include adjusting the output powers based on energy levels of the signals provided to the PAs compared to a reference energy level. For instance, each of the input signal energies may be compared to a reference energy level $E_{REF}$. Then, multiple ratios may be determined corresponding to the signal energy levels determined at the block 454 compared to $E_{REF}$. For example, if there are three antennas, the signal energies may be designated as $E_1$, $E_2$ and $E_3$. Then, a ratio $\alpha_1$ may be calculated as $E_1/E_{REF}$; a ratio $\alpha_1$ may be calculated as $E_2/E_{REF}$; and a ratio $\alpha_2$ may be calculated as $E_3/E_{REF}$. Next, the output powers of the PAs may be set based on the determined ratios so that the output powers of the remaining PAs are approximately equal. Referring to FIG. 4, the controller 316 may set the output power of the PAs based on the determined ratios by generating control signals that are provided to the PAs 304, 308, 312.

Of course, the output powers of the PAs may be adjusted based on the energy levels determined at the block 454 in other ways as well, so that the output powers of the PAs are approximately the same level.

In some embodiments, PA output level adjustment may be disabled. For example, it may be determined in some situations that the output levels of all of the PAs should be kept at or near the same level, such as the maximum output power level. For instance, if the rows of the steering matrix have nearly the same energy, and/or if (in an OFDM system) if the energy level of each signal varies significantly between the subchannels, it may be determined that the output levels of all of the PAs should be kept at or near the same level.

Although examples were described above in which a transmitter included three antennas, it will be apparent to one of ordinary skill in the art that power amplifier control techniques such as described herein can be applied to transmitters having different numbers of antennas such as two, four, five, six, seven, etc.

The power amplifier control techniques described above may be utilized in various MIMO devices. For example, power amplifier control techniques such as described above may be utilized in base stations, access points, wireless routers, personal computers, mobile communication devices, mobile phones, etc. Additionally, FIGS. 8A-8F illustrate various devices in which power amplifier control techniques such as described above, may be employed.

Figure 8A:
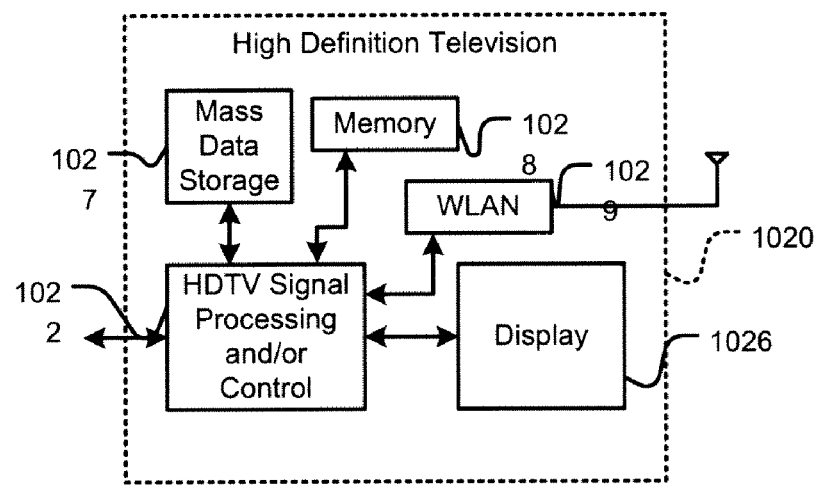
FIG. 8A is a block diagram of a high definition television that may utilize power amplifier control techniques such as described herein.

Referring now to FIG. 8A, such techniques may be utilized in a high definition television (HDTV) 1020. HDTV 1020 includes a mass data storage 1027, an HDTV signal processing and control block 1022, a WLAN interface and memory 1028. HDTV 1020 receives HDTV input signals in either a wired or wireless format and generates HDTV output signals for a display 1026. In some implementations, signal processing circuit and/or control circuit 1022 and/or other circuits (not shown) of HDTV 1020 may process data, perform coding and/or encryption, perform calculations, format data and/or perform any other type of HDTV processing that may be required.

HDTV 1020 may communicate with a mass data storage 1027 that stores data in a nonvolatile manner such as optical and/or magnetic storage devices. The mass storage device may be a mini HDD that includes one or more platters having a diameter that is smaller than approximately 1.8"HDTV 1020 may be connected to memory 1028 such as RAM, ROM, low latency nonvolatile memory such as flash memory and/or other suitable electronic data storage. HDTV 1020 also may support connections with a WLAN via a WLAN network interface 1029. The WLAN network interface 1029 may implement power amplifier control techniques and/or include a power amplifier control system such as described above.

Figure 8B:
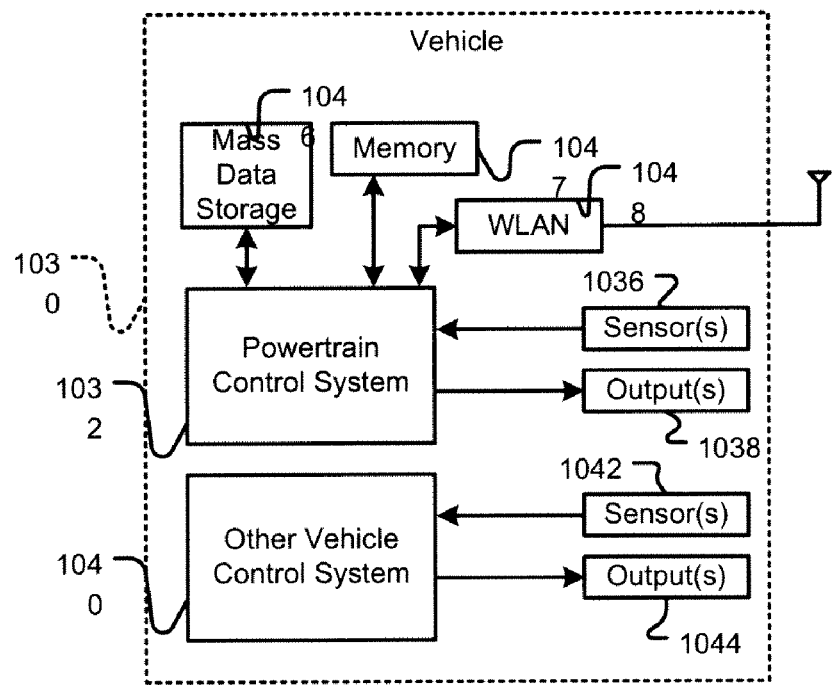
FIG. 8B is a block diagram of a vehicle that may utilize power amplifier control techniques such as described herein.

Referring now to FIG. 8B, such techniques may be utilized in a vehicle 1030. The vehicle 1030 includes a control system that may include mass data storage 1046, as well as a WLAN interface 1048. The mass data storage 1046 may support a powertrain control system 1032 that receives inputs from one or more sensors 1036 such as temperature sensors, pressure sensors, rotational sensors, airflow sensors and/or any other suitable sensors and/or that generates one or more output control signals 1038 such as engine operating parameters, transmission operating parameters, and/or other control signals.

Control system 1040 may likewise receive signals from input sensors 1042 and/or output control signals to one or more output devices 1044. In some implementations, control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like.

Powertrain control system 1032 may communicate with mass data storage 1027 that stores data in a nonvolatile manner such as optical and/or magnetic storage devices. The mass storage device 1046 may be a mini HDD that includes one or more platters having a diameter that is smaller than approximately 1.8"Powertrain control system 1032 may be connected to memory 1047 such as RAM, ROM, low latency nonvolatile memory such as flash memory and/or other suitable electronic data storage. Powertrain control system 1032 also may support connections with a WLAN via a WLAN network interface 1048. The control system 1040 may also include mass data storage, memory and/or a WLAN interface (all not shown). In one exemplary embodiment, the WLAN network interface 1048 may implement power amplifier control techniques and/or include a power amplifier control system such as described above.

Figure 8C:
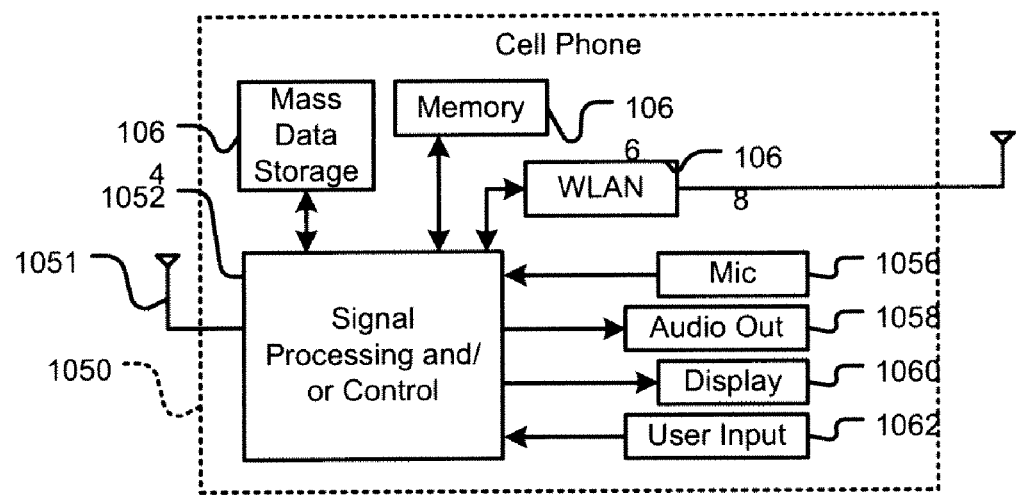
FIG. 8C is a block diagram of a cellular phone that may utilize power amplifier control techniques such as described herein.

Referring now to FIG. 8C, such techniques may be used in a cellular phone 1050 that may include a cellular antenna 1051. The cellular phone 1050 may include either or both signal processing and/or control circuits, which are generally identified in FIG. 8C at 1052, a WLAN network interface 1068 and/or mass data storage 1064 of the cellular phone 1050. In some implementations, cellular phone 1050 includes a microphone 1056, an audio output 1058 such as a speaker and/or audio output jack, a display 1060 and/or an input device 1062 such as a keypad, pointing device, voice actuation and/or other input device. Signal processing and/or control circuits 1052 and/or other circuits (not shown) in cellular phone 1050 may process data, perform coding and/or encryption, perform calculations, format data and/or perform other cellular phone functions.

Cellular phone 1050 may communicate with mass data storage 1064 that stores data in a nonvolatile manner such as optical and/or magnetic storage devices for example hard disk drives HDD and/or DVDs. The HDD may be a mini HDD that includes one or more platters having a diameter that is smaller than approximately 1.8". Cellular phone 1050 may be connected to memory 1066 such as RAM, ROM, low latency nonvolatile memory such as flash memory and/or other suitable electronic data storage. Cellular phone 1050 also may support connections with a WLAN via a WLAN network interface 1068. The WLAN network interface 1068 may implement power amplifier control techniques and/or include a power amplifier control system techniques such as described above.

Figure 8D:
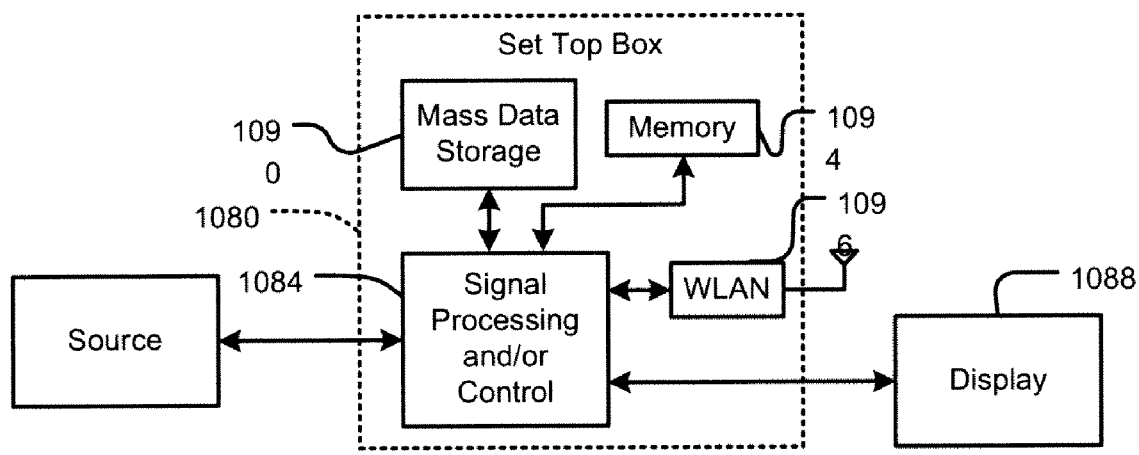
FIG. 8D is a block diagram of a set top box that may utilize power amplifier control techniques such as described herein.

Referring now to FIG. 8D, such techniques may be utilized in a set top box 1080. The set top box 1080 may include either or both signal processing and/or control circuits, which are generally identified in FIG. 8D at 1084, a WLAN interface and/or mass data storage 1090 of the set top box 1080. Set top box 1080 receives signals from a source such as a broadband source and outputs standard and/or high definition audio/video signals suitable for a display 1088 such as a television and/or monitor and/or other video and/or audio output devices. Signal processing and/or control circuits 1084 and/or other circuits (not shown) of the set top box 1080 may process data, perform coding and/or encryption, perform calculations, format data and/or perform any other set top box function.

Set top box 1080 may communicate with mass data storage 1090 that stores data in a nonvolatile manner and may use jitter measurement. Mass data storage 1090 may include optical and/or magnetic storage devices for example hard disk drives HDD and/or DVDs. The HDD may be a mini HDD that includes one or more platters having a diameter that is smaller than approximately 1.8". Set top box 1080 may be connected to memory 1094 such as RAM, ROM, low latency nonvolatile memory such as flash memory and/or other suitable electronic data storage. Set top box 1080 also may support connections with a WLAN via a WLAN network interface 1096. The WLAN network interface 1096 may implement power amplifier control techniques and/or include a power amplifier control system such as described above.

Figure 8E:
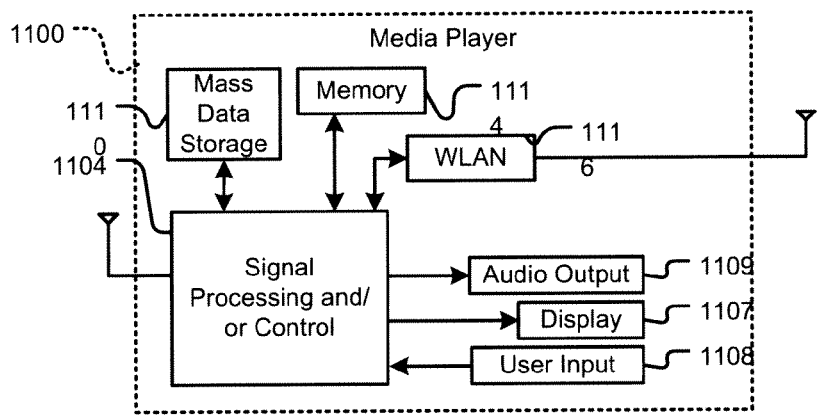
FIG. 8E is a block diagram of a media player that may utilize power amplifier control techniques such as described herein.

Referring now to FIG. 8E, such techniques may be used in a media player 1100. The media player 1100 may include either or both signal processing and/or control circuits, which are generally identified in FIG. 8E at 1104, a WLAN interface and/or mass data storage 1110 of the media player 1100. In some implementations, media player 1100 includes a display 1107 and/or a user input 1108 such as a keypad, touchpad and the like. In some implementations, media player 1100 may employ a graphical user interface (GUI) that typically employs menus, drop down menus, icons and/or a point-and-click interface via display 1107 and/or user input 1108. Media player 1100 further includes an audio output 1109 such as a speaker and/or audio output jack. Signal processing and/or control circuits 1104 and/or other circuits (not shown) of media player 1100 may process data, perform coding and/or encryption, perform calculations, format data and/or perform any other media player function.

Media player 1100 may communicate with mass data storage 1110 that stores data such as compressed audio and/or video content in a nonvolatile manner and may utilize jitter measurement. In some implementations, the compressed audio files include files that are compliant with MP3 format or other suitable compressed audio and/or video formats. The mass data storage may include optical and/or magnetic storage devices for example hard disk drives HDD and/or DVDs. The HDD may be a mini HDD that includes one or more platters having a diameter that is smaller than approximately 1.8". Media player 1100 may be connected to memory 1114 such as RAM, ROM, low latency nonvolatile memory such as flash memory and/or other suitable electronic data storage. Media player 1100 also may support connections with a WLAN via a WLAN network interface 1116. The WLAN network interface 1116 may implement power amplifier control techniques and/or include a power amplifier control system such as described above.

Figure 8F:
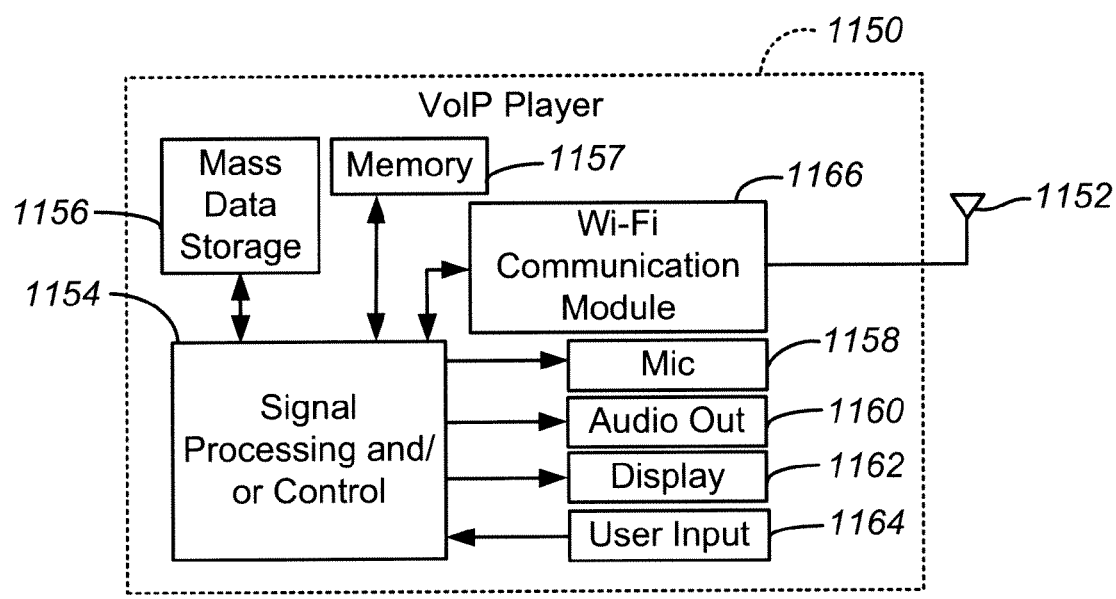
FIG. 8F is a block diagram of a voice over IP device that may utilize power amplifier control techniques such as described herein.

Referring to FIG. 8F, such techniques may be utilized in a Voice over Internet Protocol (VoIP) phone 1150 that may include an antenna 1152. The VoIP phone 1150 may include either or both signal processing and/or control circuits, which are generally identified in FIG. 8F at 1154, a wireless interface and/or mass data storage of the VoIP phone 1150. In some implementations, VoIP phone 1150 includes, in part, a microphone 1158, an audio output 1160 such as a speaker and/or audio output jack, a display monitor 1162, an input device 1164 such as a keypad, pointing device, voice actuation and/or other input devices, and a Wireless Fidelity (WiFi) communication module 1166. Signal processing and/or control circuits 1154 and/or other circuits (not shown) in VoIP phone 1150 may process data, perform coding and/or encryption, perform calculations, format data and/or perform other VoIP phone functions.

VoIP phone 1150 may communicate with mass data storage 1156 that stores data in a nonvolatile manner such as optical and/or magnetic storage devices, for example hard disk drives HDD and/or DVDs. The HDD may be a mini HDD that includes one or more platters having a diameter that is smaller than approximately 1.8". VoIP phone 1150 may be connected to memory 1157, which may be a RAM, ROM, low latency nonvolatile memory such as flash memory and/or other suitable electronic data storage. VoIP phone 1150 is configured to establish communications link with a VoIP network (not shown) via WiFi communication module 1166. The WiFi communication module 1166 may implement power amplifier control techniques and/or include a power amplifier control system such as described above.

At least some of the various blocks, operations, and techniques described above may be implemented in hardware, firmware, software, or any combination of hardware, firmware, and/or software. For instance, the controller 316 may be implemented in hardware, firmware, software, or some combination of the hardware, firmware, and/or software. For example, the controller 316 may include hardware configured to implement all of the blocks of the method 350 of FIG. 5 and/or the method 400 of FIG. 6. As another example, the controller 316 may comprise a processor coupled to a memory that has stored therein computer readable instructions that cause the processor to implement all of the blocks of the method 350 of FIG. 5 and/or the method 400 of FIG. 6. As yet another example, the controller 316 may include hardware configured to implement some of the blocks of the method 350 of FIG. 5 and/or the method 400 of FIG. 6, and may include a processor coupled to a memory that has stored therein computer readable instructions that cause the processor to implement the other blocks of the method 350 of FIG. 5 and/or the method 400 of FIG. 6. For instance, the block 354 and/or the block 404 may be implemented in hardware, whereas the other blocks of the method 350 of FIG. 5 and/or the method 400 of FIG. 6 may be implemented in software.

When implemented in software or firmware, the software or firmware may be stored in any computer readable memory such as on a magnetic disk, an optical disk, or other storage medium, in a RAM or ROM or flash memory, processor, hard disk drive, optical disk drive, tape drive, etc. Likewise, the software or firmware may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software or firmware may be delivered to a user or a system via a communication channel such as a telephone line, a DSL line, a cable television line, a fiber optics line, a wireless communication channel, the Internet, etc. (which are viewed as being the same as or interchangeable with providing such software via a transportable storage medium). The software or firmware may include machine readable instructions that are capable of causing one or more processors to perform various acts.

When implemented in hardware, the hardware may comprise one or more of discrete components, an integrated circuit, an application-specific integrated circuit (ASIC), etc.

While the present invention has been described with reference to specific examples, which are intended to be illustrative only and not to be limiting of the invention, it will be apparent to those of ordinary skill in the art that changes, additions or deletions in addition to those explicitly described above may be made to the disclosed embodiments without departing from the spirit and scope of the invention.

What is claimed is:

1. A method, comprising:
   applying one or more beamsteering matrices to a plurality of signals to be transmitted via multiple antennas;
   after applying the one or more beamsteering matrices to the plurality of signals, providing the plurality of signals to a plurality of power amplifiers coupled to the multiple antennas;
   determining signal energies for the plurality of signals provided to the plurality of power amplifiers;
   comparing one of the determined signal energies to each of one or more other determined signal energies;
   determining a maximum signal energy corresponding to one of the plurality of signals;
   determining one or more ratios, comprising, for each of the one or more other signals in the plurality of signals, determining a respective ratio of the signal energy of the other signal to the maximum signal energy; and
   controlling the plurality of power amplifiers via power amplifier control inputs to adjust output power levels of the plurality of power amplifiers, wherein adjusting output power levels comprises
   i) setting an output power level of a power amplifier corresponding to the maximum signal energy to a defined output power level, and
   ii) setting a corresponding output power level for each of one or more additional power amplifiers to a corresponding power level based on a corresponding determined ratio.

2. The method of claim 1, wherein determining signal energies for the plurality of signals comprises analyzing the plurality of signals.

3. The method of claim 2, wherein determining signal energies for the plurality of signals comprises computing respective sums of squared amplitudes for the plurality of signals provided to the plurality of power amplifiers.

4. The method of claim 1, wherein determining signal energies for the plurality of signals comprises analyzing the one or more beamsteering matrices.

5. The method of claim 4, wherein determining signal energies for the plurality of signals comprises summing squared magnitudes of matrix coefficients in rows of the one or more beamsteering matrices.

6. The method of claim 4, wherein applying the one or more beamsteering matrices to the plurality of signals comprises applying a plurality of beamsteering matrices to the plurality of signals;
   wherein determining signal energies for the plurality of signals comprises summing squared magnitudes of matrix coefficients in rows of a subset of the plurality of beamsteering matrices.

7. The method of claim 1, wherein, for each of the one or more additional power amplifiers, the corresponding power level is below the defined output power level.

8. The method of claim 1, wherein the defined output power level is a maximum output power level.

9. The method of claim 1, wherein comparing the signal energies for the plurality of signals provided to the plurality of power amplifiers comprises comparing each of the signal energies to a reference signal energy.

10. The method of claim 1, wherein adjusting the output power levels of the plurality of power amplifiers comprising adjusting the output power levels of the plurality of power amplifiers so that the relative output power levels correspond to the relative signal energies.

11. The method of claim 1, wherein adjusting the output power levels of the plurality of power amplifiers comprising adjusting the output power levels of the plurality of power amplifiers so that the output power levels are equal.

12. A power amplifier control apparatus, comprising a controller configured to:
   determine signal energies for a plurality of signals provided to a plurality of power amplifiers coupled to a plurality of transmit antennas, wherein one or more beamsteering matrices are applied to the plurality of signals;
   compare one of the determined signal energies to each or one or more other determined signal energies;
   determine a maximum signal energy corresponding to one of the plurality of signals;

determine one or more ratios, comprising, for each of the one or more other signals in the plurality of signals, determining a respective ratio of the signal energy of the other signal to the maximum signal energy; and generate control signals to be supplied to control inputs of the plurality of power amplifiers to adjust output power levels of the plurality of power amplifiers, wherein adjusting output power levels comprises
  i) setting an output power level of a power amplifier corresponding to the maximum signal energy to a defined output power level and
  ii) setting a corresponding output power level for each of one or more additional power amplifiers to a corresponding power level based on a corresponding determined ratio.

13. The apparatus of claim 12, wherein the controller receives the plurality of signals and is configured to determine the signal energies for the plurality of signals based on an analysis of the plurality of signals.

14. The apparatus of claim 13, wherein the controller is configured to compute respective sums of squared amplitudes for the plurality of signals.

15. The apparatus of claim 12, wherein the controller receives one or more beamsteering matrices and is configured to determine the signal energies for the plurality of signals based on an analysis of the one or more beamsteering matrices.

16. The apparatus of claim 15, wherein the controller is configured to sum squared magnitudes of matrix coefficients in rows of the one or more beamsteering matrices.

17. The apparatus of claim 15, wherein the one or more beamsteering matrices comprises a plurality of beamsteering matrices;
  wherein the controller is configured to sum squared magnitudes of matrix coefficients in rows of a subset of the plurality of beamsteering matrices.

18. The apparatus of claim 12, wherein the controller is configured to generate the control signals to set the corresponding power level for each of the one or more additional power amplifiers to a corresponding power level that is below the defined output power level.

19. The apparatus of claim 12, wherein the controller is configured to compare each of the signal energies to a reference signal energy.

20. The apparatus of claim 12, wherein the controller is configured to adjust the output power levels of the plurality of power amplifiers so that the relative output power levels correspond to the relative signal energies.

21. The apparatus of claim 12, wherein the controller is configured to adjust the output power levels of the plurality of power amplifiers so that the output power levels are equal.

22. A wireless transmitter for transmitting an information signal, the wireless transmitter comprising:
  a signal modulator adapted to modulate the information signal to produce a modulated signal;
  a plurality of transmission antennas;
  a beamforming network coupled between the signal modulator and the plurality of transmission antennas;
  a first controller coupled to the beamforming network to control the beamforming network using one or more beamsteering matrices so as to produce a transmit gain pattern having one or more high gain lobes when the modulated signal is transmitted via the plurality of transmission antennas;
  a plurality of power amplifiers coupled to the beamforming network and the plurality of transmission antennas; and
  a second controller coupled to the plurality of amplifiers, the second controller configured to:
  determine signal energies for a plurality of signals provided to the plurality of power amplifiers,
  compare one of the determined signal energies to each or one or more other determined signal energies;
  determine a maximum signal energy corresponding to one of the plurality of signals;
  determine one or more ratios, comprising, for each of the one or more other signals in the plurality of signals, determining a respective ratio of the signal energy of the other signal to the maximum signal energy; and
  generate control signals to be supplied to control inputs of the plurality of power amplifiers to adjust output power levels of the plurality of power amplifiers, wherein adjusting output power levels comprises
    i) setting an output power level of a power amplifier corresponding to the maximum signal energy to a defined output power level and
    ii) setting a corresponding output power level for each of one or more additional power amplifiers to a corresponding power level based on a corresponding determined ratio.

23. The wireless transmitter of claim 22, wherein the second controller receives the plurality of signals;
  wherein the second controller is configured to determine the signal energies for the plurality of signals based on an analysis of the plurality of signals.

24. The wireless transmitter of claim 22, wherein the second controller receives the one or more beamsteering matrices;
  wherein the second controller is configured to determine the signal energies for the plurality of signals based on an analysis of the one or more beamsteering matrices.

25. The wireless transmitter of claim 24, wherein the second controller is coupled to a steering matrix memory.

26. The wireless transmitter of claim 22, further comprising a steering matrix calculation unit.

27. The wireless transmitter of claim 22, wherein the second controller is configured to adjust the output power levels of the plurality of power amplifiers so that the relative output power levels correspond to the relative signal energies.

28. The wireless transmitter of claim 22, wherein the second controller is configured to adjust the output power levels of the plurality of power amplifiers so that the output power levels are equal.

29. A method of wirelessly transmitting an information signal via multiple antennas, the method comprising:
  modulating the information signal to produce a modulated signal;
  applying one or more beamsteering matrices to the modulated signal to produce a plurality of output signals;
  providing the plurality of output signals to a plurality of power amplifiers, wherein the plurality of power amplifiers are coupled to the multiple antennas;
  determining signal energies for the plurality of output signals;
  comparing one of the determined signal energies to each of one or more other determined signal energies;
  determining a maximum signal energy corresponding to one of the plurality of signals;
  determining one or more ratios, comprising, for each of the one or more other signals in the plurality of signals, determining a respective ratio of the signal energy of the other signal to the maximum signal energy; and controlling the plurality of power amplifiers via power amplifier control inputs to adjust output power levels of the plurality of power amplifiers, wherein adjusting output power levels comprises
   i) setting an output power level of a power amplifier corresponding to the maximum signal energy to a defined output power level, and
   ii) setting a corresponding output power level for each of one or more additional power amplifiers to a corresponding power level based on a corresponding determined ratio.

30. The method of claim 29, wherein determining signal energies for the plurality of output signals comprises analyzing the plurality of output signals.

31. The method of claim 29, wherein determining signal energies for the plurality of output signals comprises analyzing the one or more beamsteering matrices.

32. The method of claim 29, wherein adjusting the output power levels of the plurality of power amplifiers comprising adjusting the output power levels of the plurality of power amplifiers so that the relative output power levels correspond to the relative signal energies.

33. The method of claim 29, wherein adjusting the output power levels of the plurality of power amplifiers comprising adjusting the output power levels of the plurality of power amplifiers so that the output power levels are equal.

\* \* \* \* \*

UNITED STATES PATENT AND TRADEMARK OFFICE
CERTIFICATE OF CORRECTION

| | | |
|---|---|---|
| PATENT NO. | : 8,165,543 B2 | Page 1 of 1 |
| APPLICATION NO. | : 12/109257 | |
| DATED | : April 24, 2012 | |
| INVENTOR(S) | : Rohit U. Nabar et al. | |

It is certified that error appears in the above-identified patent and that said Letters Patent is hereby corrected as shown below:

Title Page

Under the type of document, code (12), "Rohit et al." should be --Nabar et al.--.

Item (75) in the list of inventors, "Nabar U. Rohit" should be --Rohit U. Nabar--.

Signed and Sealed this
Fourteenth Day of August, 2012

David J. Kappos
*Director of the United States Patent and Trademark Office*